United States Patent
Nomura et al.

[19]

[11] Patent Number: 6,146,189
[45] Date of Patent: *Nov. 14, 2000

[54] FLEXIBLE PRINTED CIRCUIT BOARD MOUNTING STRUCTURE AND RECORDING/REPRODUCING APPARATUS USING THE SAME

[75] Inventors: Tetsuya Nomura; Ryu Yunokuchi; Kouzou Onodera; Toru Sawada, all of Fukushima-ken, Japan

[73] Assignee: Alps Electric Co., Ltd., Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/873,912

[22] Filed: Jun. 12, 1997

[30] Foreign Application Priority Data

Jun. 26, 1996 [JP] Japan .................. 8-185632

[51] Int. Cl.[7] .................................................. H01R 12/24
[52] U.S. Cl. .......................................... 439/493; 439/153
[58] Field of Search ........................ 439/493, 357, 439/74, 160, 153; 369/75.2

[56] References Cited

U.S. PATENT DOCUMENTS

| | | | |
|---|---|---|---|
| 3,977,756 | 8/1976 | Rodondi | 439/357 |
| 4,029,374 | 6/1977 | Nestor et al. | 439/74 |
| 4,517,617 | 5/1985 | Tsuji et al. | 360/133 |
| 4,761,141 | 8/1988 | Hawk et al. | 439/153 |
| 5,123,004 | 6/1992 | Arai | 369/75.2 |
| 5,273,447 | 12/1993 | Heiney et al. | 439/160 |
| 5,724,210 | 3/1998 | Sawada | 360/99.06 |
| 5,835,304 | 11/1998 | Shimazu et al. | 360/99.01 |
| 5,841,606 | 11/1998 | Shimazu et al | 360/99.01 |
| 5,859,747 | 1/1999 | Sawada | 360/99.01 |
| 5,875,068 | 2/1999 | Sawada | 360/99.01 |
| 5,896,357 | 4/1999 | Shinozaki et l. | 369/77.2 |

FOREIGN PATENT DOCUMENTS 7-31416  7/1995  Japan .

Primary Examiner—Renee Luebke
Assistant Examiner—Antoine Ngandjui
Attorney, Agent, or Firm—Brinks Hofer Gilson & Lione

[57] ABSTRACT

Disclosed is an inexpensive structure for mounting a flexible printed circuit board to a hard circuit board without using a connector. The terminal section of the flexible printed circuit board is mounted to a holding member, which is secured to the hard circuit board to electrically connect the wiring pattern of the terminal section to the electric circuit of the hard circuit board, whereby it is possible to mount the flexible printed circuit board to the hard circuit board without using an expensive connector, thereby achieving an improvement in terms of cost and operability.

16 Claims, 11 Drawing Sheets

FLEXIBLE PRINTED CIRCUIT BOARD MOUNTING STRUCTURE AND RECORDING/REPRODUCING APPARATUS USING THE SAME

BACKGROUND OF THE INVENTION

1. Field of the Invention

The present invention relates to a mounting structure for a flexible printed circuit board (hereinafter referred to as "FPC") for transmitting signals to a recording/reproducing head in a recording/reproducing apparatus using a recording/reproducing disk, such as a floppy disk or a hard disk, and to a recording/reproducing apparatus using the mounting structure.

2. Description of the Related Art

An example of a well-known type of magnetic recording/reproducing apparatus using a floppy disk is disclosed in Japanese Utility Model Unexamined Publication No. 63-72712. Generally speaking, a conventional recording/reproducing apparatus of the type in which recording and reproduction are effected on and from the upper and lower sides of a recording/reproducing disk by using upper and lower recording/reproducing heads is constructed as shown in FIG. 21.

The conventional recording/reproducing apparatus shown in FIG. 21 comprises a carriage 101, an arm 105 which is mounted to a mounting base 102 of the carriage 101 through the intermediation of a plate spring 103 or the like by means of a plurality of screws 104 or the like so as to be vertically rotatable and which is biased so as to rotate downwardly by the plate spring 103 or the like, and upper and lower recording/reproducing heads 107 and 108 consisting of magnetic heads which are respectively attached to upper and lower opposing surfaces 101a and 105a of the carriage 101 and the arm 105 through the intermediation of mounting plates 106, wherein these recording/reproducing heads 107 and 108 are held in elastic contact with the upper and lower sides of a recording/reproducing disk 109 consisting of a floppy disk and wherein the carriage 101 is moved in the directions indicated by arrows a, which correspond to the radial dimension of the disk 109 by means of a lead screw (not shown). While turning the disk 109 at high speed, the recording/reproducing heads 107 and 108 are moved in the directions indicated by the arrows a to effect recording and reproduction on and from the upper and lower sides of the disk 109.

In the recording/reproducing apparatus constructed as described above, recording/reproducing signals are transmitted by using FPCs 111 and 112 connected to the upper and lower recording/reproducing heads 107 and 108. As shown in FIG. 22, connectors 114, which are provided beforehand on a relatively rigid hard circuit (base) board 113, protrude through a through-hole 115a into a chassis 115 of the recording/reproducing apparatus in which the recording/reproducing heads 107 and 108, etc. are arranged. Further, the FPCs 111 and 112, which are connected to the recording/reproducing heads 107 and 108, are led to the exterior from the arm 105 and the carriage 101, and one end portion of each of the FPCs 111 and 112 is inserted into an insertion section 114a of the connector 114, whereby electrical connection is established between the recording/reproducing heads 107 and 108 and the board 113. Further, a reinforcing plate 116 is attached to the back side of one end portion of each of the FPCs 111 and 112 to facilitate the insertion thereof into the insertion section 114a of the connector 114.

As described above, in the above conventional recording/reproducing apparatus, the mounting structure for mounting the FPCs 111 and 112 to the board 113 uses connectors 114, to which one end portion of each of the FPCs 111 and 112 is connected. The reason for using these connectors 114 is that, even when the FPCs 111 and 112 are pulled as a result of the end portions thereof on the side of the recording/reproducing heads 107 and 108 moving in the directions indicated by the arrows a, there is no concern that a defective conduction between the recording/reproducing heads 107, 108 and the hard circuit board 103 since one end portion of the FPC 111, 112 is reliably secured and connected to the connector 114, thereby providing a high level of reliability.

However, when considered in the light of the recent remarkable reduction in the price of recording/reproducing apparatuses, the connectors 114 are rather expensive, and there a requirement that one end portion of the FPC 111, 112 should be directly connected to the base board 113 without using any connectors 114. However, when the FPCs 111 and 112 are directly joined to the base board 113 solely by soldering, the requisite level of connection strength cannot be attained, so that the solder will easily come off due to the repeated expansion and contraction of the FPCs as a result of the recording/reproducing heads 107 and 108 advancing and retracting in the directions of the arrows a. Further, due to the flexibility of the FPCs 111 and 112, the positioning of the FPCs 111 and 112 at desired positions on the board 113 is rather difficult to perform when mounting the FPCs 111 and 112 to the board 113, so that positional deviation will be easily developed unless the force is properly applied when mounting, which means a poor operability in soldering.

SUMMARY OF THE INVENTION

It is accordingly an object of the present invention to provide a mounting structure for mounting the FPCs to the board which uses no connectors, which is inexpensive and which provides high operability and enables the FPCs to be reliably connected. Further, the present invention aims to achieve a reduction in the price of a recording/reproducing apparatus.

In accordance with the present invention, there is provided an FPC mounting structure in which the terminal portion of an FPC is mounted to a holding member, which is secured to the hard circuit board, thereby electrically connecting the wiring pattern of the terminal portion to the electric circuit of the hard circuit board.

Further, in accordance with the present invention, there is provided an FPC mounting structure in which the holding member is composed of a main body portion and a door portion rotatably provided on the main body portion, wherein the terminal portion of the FPC is mounted to the main body portion and the door portion, and wherein the holding member is secured to the hard circuit board to thereby establish electrical connection between the wiring pattern of the terminal portion and the electric circuit of the hard circuit board.

Further, in accordance with the present invention, there is provided an FPC mounting structure in which the hard circuit board is arranged in a chassis, wherein the holding member is equipped with an engagement portion and wherein the engagement portion is engaged with the chassis.

Further, in accordance with the present invention, there is provided a recording/reproducing apparatus in which the terminal portion of an FPC for transmitting recording/reproducing signals is mounted to a holding member, and a hard circuit board is arranged in a chassis, wherein the holding member is secured to the hard circuit board, and wherein the wiring pattern of the terminal portion is electrically connected to the electric circuit of the hard circuit board.

Further, in accordance with the present invention, there is provided a recording/reproducing apparatus in which the holding member is equipped with an engagement portion, wherein the engagement portion is engaged with the chassis.

DESCRIPTION OF THE PREFERRED EMBODIMENTS

Figure 11:
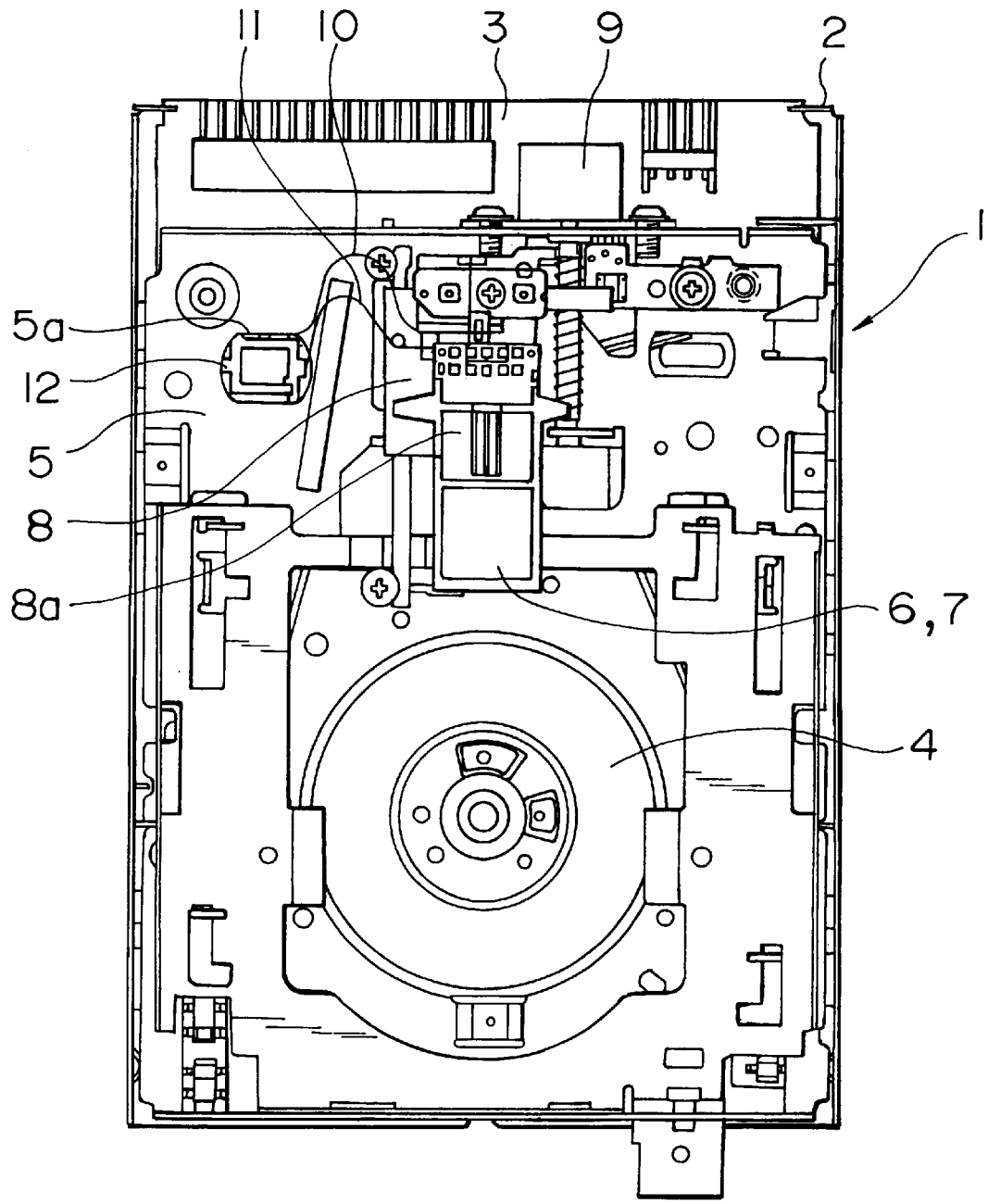
FIG. 11 is a plan view showing the interior of a recording/reproducing apparatus using the FPC mounting structure of the present invention, with the top cover of the apparatus removed.

The first embodiment of the present invention will be described with reference to the drawings. First, FIG. 11 is a plan view of a recording/reproducing apparatus using a floppy disk according to the present invention, with the top cover of the apparatus being removed. In the drawing, the recording/reproducing apparatus 1 includes a lower cover 2, a chassis 5 provided with a relatively rigid hard circuit board 3 consisting of a phenol resin board for signal control and a spindle motor 4, a carriage provided on the chassis 5 and having on the lower side of its forward end portion a recording/reproducing head 6, an arm 8a having an upper recording/reproducing head 7 and hinge-connected to the carriage 8 and biased so as to rotate downwardly by a plate spring, a stepping motor 9 for transferring the carriage 8 along a radial dimension of the floppy disk, etc.

FPCs 10 and 11 for signal transmission connected to the pair of recording/reproducing heads 6 and 7, respectively, are led out, with one end portion of each of the FPCs 10 and 11 being held by a holding member 12. Further, this holding member 12 is inserted into an oval-shaped through-hole 5a provided in the chassis 5, and attached to the board 3, thereby establishing electrical connection between the FPCs 10, 11 and the electric circuit (not shown) of the board 3.

Next, the construction of the holding member 12 will be described in more detail with reference to FIGS. 1 through 5.

The holding member 12 is formed of a forming material, such as ABS (acrylonitrile-butadiene-styrene) resin, and is composed of a main body portion 13 consisting of first, second and third flat portions 13a, 13b and 13c formed into a substantially U-shaped configuration, and a door portion 14 integrally formed with the main body portion and connected to the free end of the flat portion 13a through the intermediation of a thin-walled section 15. The door portion 14 is rotatable on the thin-walled section 15, and adapted to close the opening 16 of the U-shaped main body portion 13.

Further, the first and third flat portions 13a and 13c of the main body portion 13, which are opposed to each other, are provided with protrusions 13d and 13e, respectively, which are integrally formed with the flat portions and situated substantially at the center of the flat portions. The protrusions 13d and 13e extend from the lower end of the first and third flat portions 13a and 13c and have elasticity, forming at their forward end claw-like engagement sections 13f and 13g. The second flat portion 13b of the main body portion 13 has substantially at its center a cylindrical protrusion 13h. Further, guide sections 13i and 13j are formed on both side ends of the plate portions so as to protrude in a predetermined height and exhibit a step section. To enable FPCs described below to be taken out, the range of one guide section 13j is restricted as compared to that of the other guide section 13i. Further, a part of the back surface of the flat portion 13b is formed as a tapered section 131 tapered toward the lower end.

The door portion 14b has on the surface facing inward when it is closed on the main body portion 13 a cylindrical protrusion 14a similar to that of the second flat portion 13b, guide sections 14b and 14c on both sides of the plate, and a protrusion 14d at the lower end of the plate. Further, a part of the surface directed to the outside of the door portion 14 is formed as a tapered section 14e. The above-mentioned protrusion 14a is offset from the center of the door portion 14 toward the thin-walled section 15.

Further, a tapered section 14f is provided in a part of the open end of the door portion 14, making it possible for the door portion 14 to be easily snapped on when the door portion 14 is closed against the resilient force of the third flat portion 13c of the main body portion 13. On the inner side of the third flat portion 13c, there are provided a stopper plate 13p and an engagement section 13q which serves as the stopper when the door 14 is closed.

Figure 1:
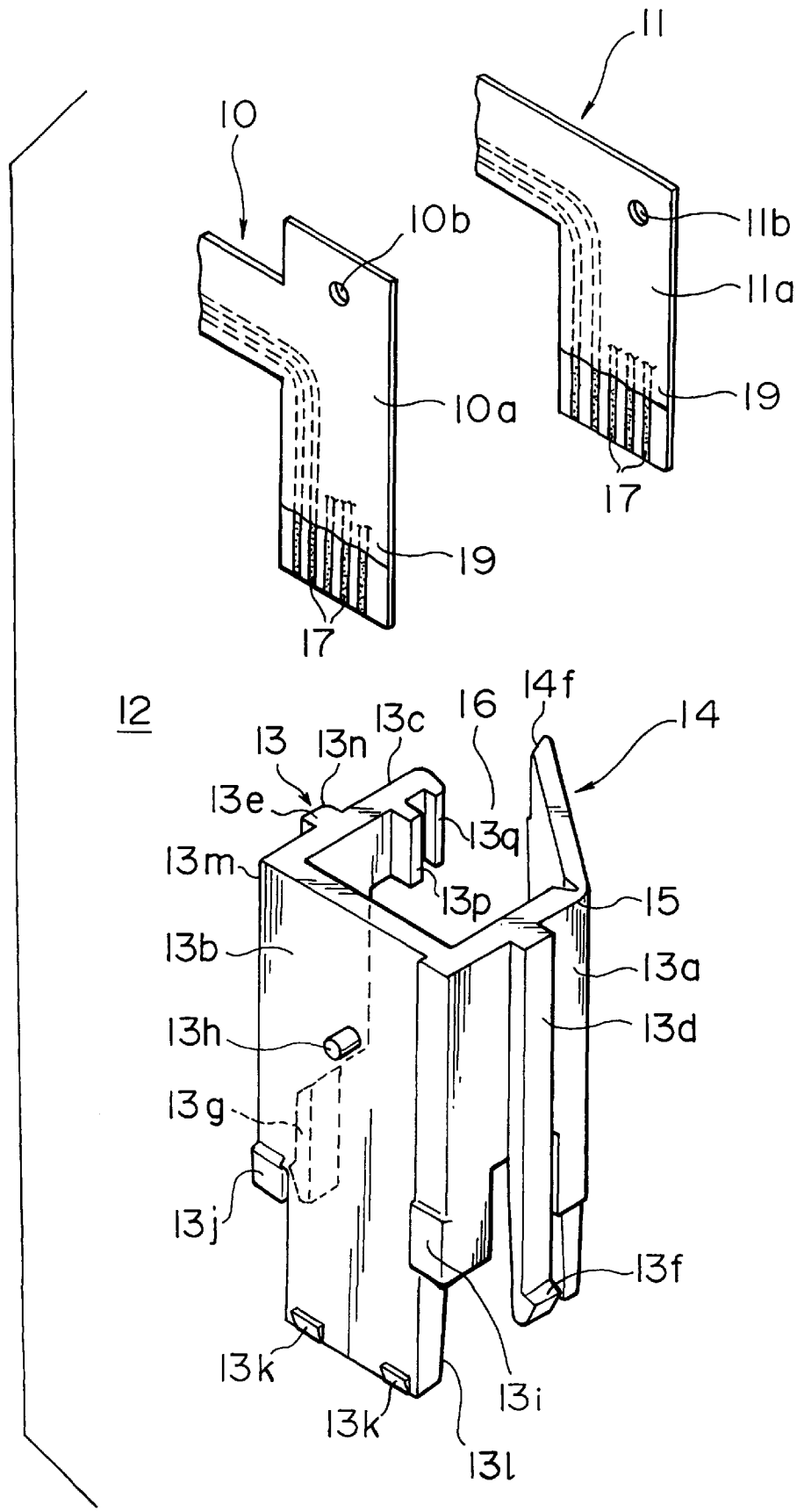
FIG. 1 is a perspective view showing a holding member and FPCs according to the present invention.
Figure 2:
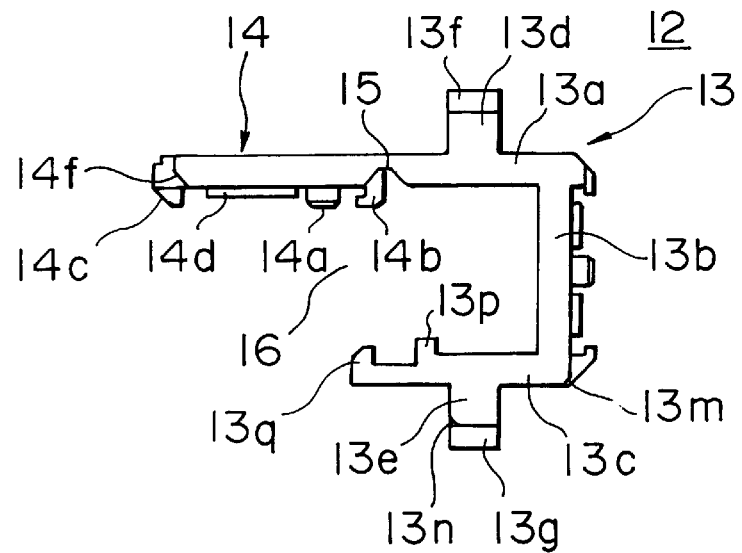
FIG. 2 is a plan view of the holding member of the present invention with its door portion open.
Figure 3:
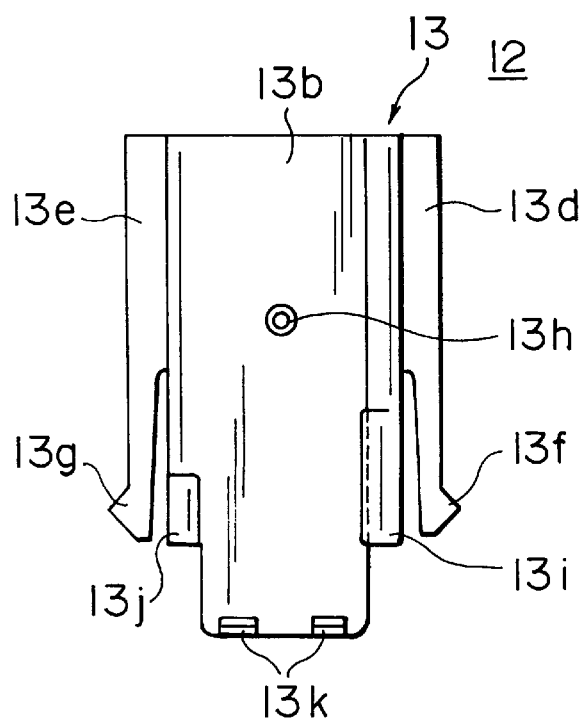
FIG. 3 is a side view of the holding member of the present invention.
Figure 4:
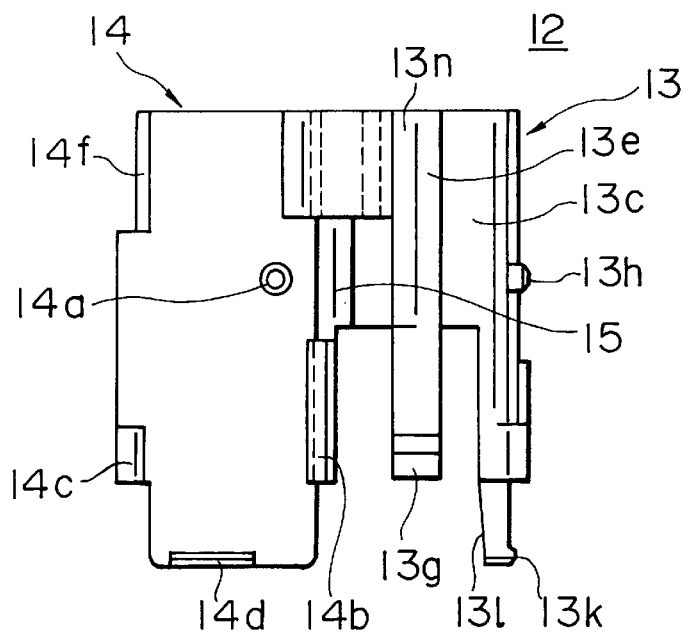
FIG. 4 is a front view of the holding member of the present invention.
Figure 5:
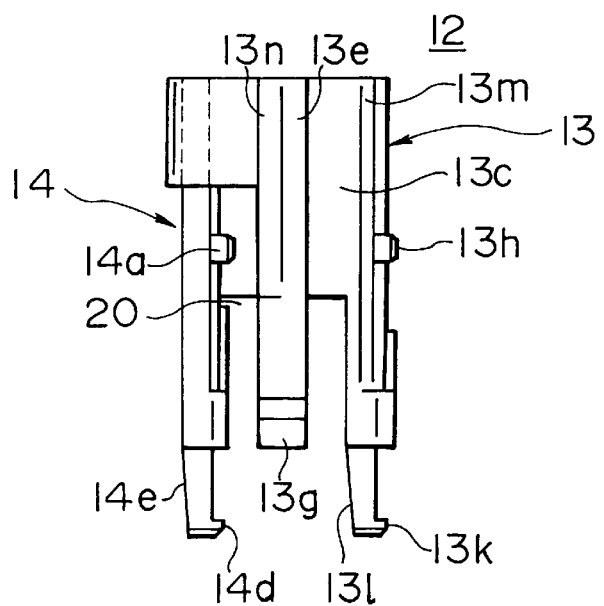
FIG. 5 is a front view of the holding member of the present invention with its door portion closed.

Further, as shown in FIG. 5, when the main body portion 13 is closed by the door portion 14, a part of the section between the door portion 14 and the third flat portion 13c is an opening 20. Further, a curved section 13m is provided at the corner between the second and third flat portions 13b and 13c of the main body portion 13 which are adjacent to each other. Similarly, a curved section 13n is also formed at a part of the corner of the above-mentioned protrusion 13e.

Figure 6:
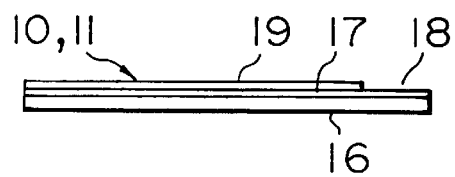
FIG. 6 is a side sectional view of an essential part of the FPC for illustrating the construction thereof.

Next, the mounting of the FPCs 10 and 11 to the holding member 12 will be described. First, as shown in FIG. 6, the FPC.10, 11 has a base film 16 of polyimide or the like, on which a wiring pattern 17 consisting of copper foil is formed. Further, a cover coat 19 consisting of polyimide or the like is provided on the wiring pattern 17 except for the section 18 where connection to the exterior is effected by soldering or the like. On end portion of the FPC 10, 11 led out from the recording/reproducing head 6, 7 is formed as a terminal section 10a, 11a whose lead-out direction is bent substantially at right angles, and a through-hole 10b, 11b is provided in the terminal section 10a, 11a, a part of the above-mentioned wiring pattern 17 being exposed at the forward end thereof. The through-hole 10b, 11b is provided at a position where it does not interfere with the routing of the wiring pattern 17. An ordinary double-coated adhesive tape (not shown) is glued to the back side of the terminal section 10a, 11a.

Figure 7:
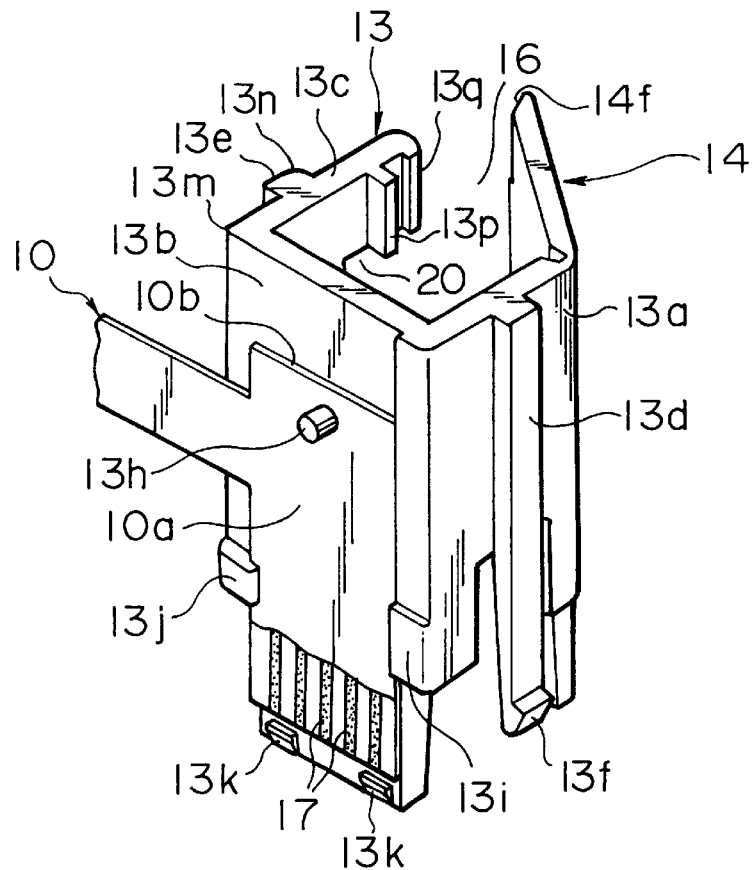
FIG. 7 is a perspective view of the holding member to which one FPC according to the present invention is mounted.

As shown in FIG. 7, the terminal section 10a of the FPC 10 is inserted along the guide sections 13i and 13j of the second flat portion 13b of the main body portion 13, and the surface of the terminal section 10a is pressed by the guide sections 13i and 13j. The protrusion 13h of the flat portion 13b is inserted into the through-hole 10b of the terminal section 10a, and, by virtue of the double-coated adhesive tape on the back side, the terminal section 10a of the FPC 10 is glued to the holding member 12. The forward end of the terminal section 10a a is situated in the vicinity of the protrusions 13k of the flat portion 13b.

Figure 8:
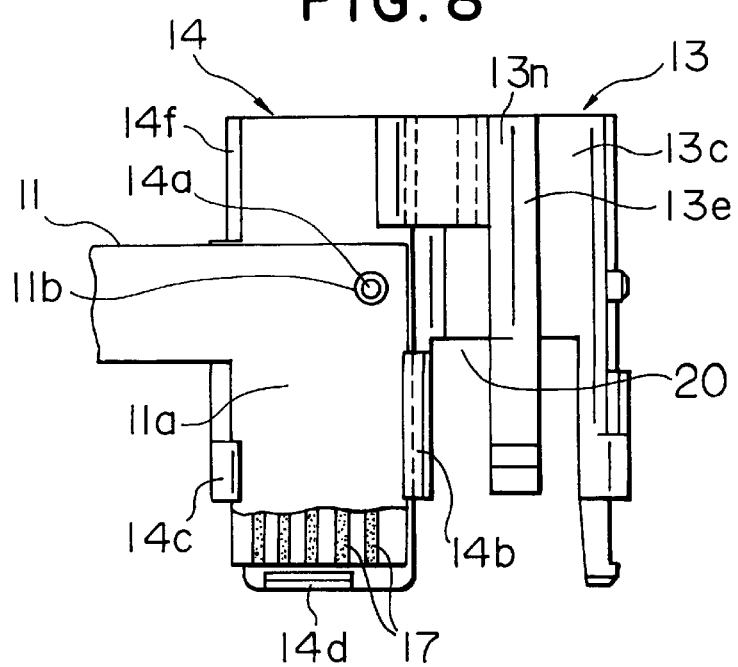
FIG. 8 is a front view showing the holding member of the present invention to the door portion of which the other FPC is, with the door portion being in the open state.

As shown in FIG. 8, when mounting the FPC 11 to the door portion 14, the door portion 14 is held in the state in which it is opened from the main body portion 13, and, as in the case of the mounting to the main body portion 13, the terminal section 11a of the other FPC 11 is guided by the guide sections 14b and 14c of the door portion 14, and the surface of the terminal section 11a is pressed by the guide sections 14b and 14c and engaged by the protrusion 14a, and, by virtue of the double-coated adhesive tape provided on the back side, attached to the plate surface of the door portion 14. After this, the door portion 14 is closed, and the tapered section 14f of the door portion 14 is snapped in between the engagement section 13q and the stopper plate 13p of the third flat portion 13c of the U-shaped main body portion 13 to close the opening 16 with the door portion 14 to thereby form the holding member having a closed cross-sectional configuration.

The section connected to the terminal section 11a of the FPC 11 provided in the door portion 14 is led to the exterior through the opening 20 of the flat portion 13c. Further, due to the above-mentioned curved section 13n of the corner of the protrusion 13e, there is no concern that the FPC 11 will be damaged to cause disconnection, etc. even if the FPC 11 is moved during operation and brought into contact therewith. Further, the terminal sections 10a and 11a of the FPCs 10 and 11 are mounted to the holding member 12 so as to extend in parallel in the same direction. The reason for providing the above-mentioned door portion 14 is to mount the terminal sections 10a a and 11a of the FPCs 10 and 11 to the holding member 12 so as to extend in parallel in the same direction. When the mounting is reversely effected, it is necessary to bend one of the FPCs 10 and 11, so that there is a concern that disconnection, etc. will be caused.

Figure 9:
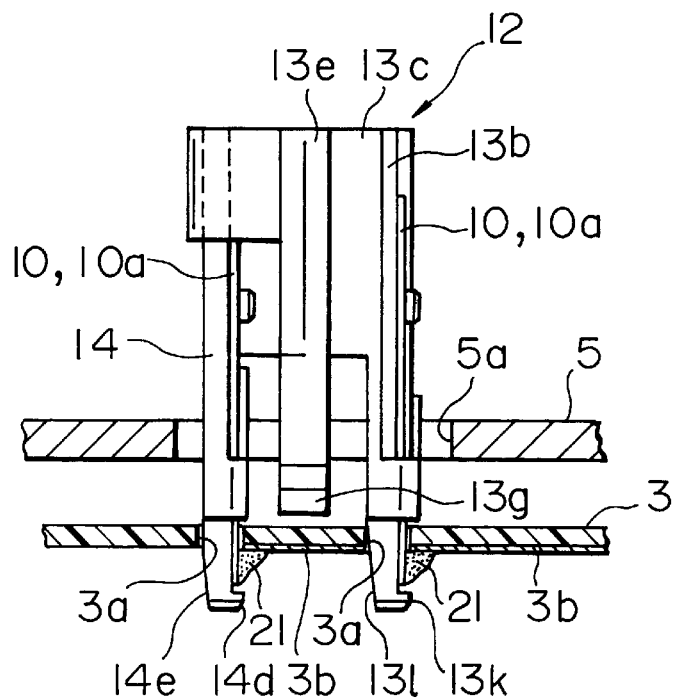
FIG. 9 is a side sectional view of an essential part of the holding member of the present invention, showing the holding member as mounted to a hard circuit board.

Next, with reference to FIG. 9, the mounting of the holding member 12, to which the FPCs 10 and 11 have been attached, to the hard circuit board 3 will be described. First, the lower end of the holding member 12 is inserted into the through-hole 5a of the chassis 5. Further, the lower end of the second flat portion 13b and the door portion 14 of the holding member 12 is fitted into the predetermined hole 3a of the board 3 along the tapered sections 13l and 14e thereof. Since the forward ends of the terminal sections 10a a and 11a of the FPCs are guarded by the protrusions 13k and 14d, there is no concern that the forward end portions of the FPCs 10 and 11 will be turned up as a result of hitting against the edge of the hole 3a. On the other hand, the terminal sections 10a and 11a are automatically pressed against one edge portion of the hole 3a due to the tapered sections 13l and 14e, and the wiring pattern 17 of the terminal section 10a, 11a is brought into close contact with the electric circuit 3b of the board 3, thereby facilitating the soldering to the board 3, etc. described below.

Further, the holding member 12 is inserted, and the engagement sections 13f and 13g of the first and third, opposed flat portions 13a and 13c are elastically engaged with the edge portion of the through-hole 5a of the chassis 5 to thereby mount the holding member 12. Next, electrical conduction is established between the electric circuit 3b of the board 3 and the exposed wiring pattern of the terminal section 10a, 11a by means of solder 21 or the like, thereby completing the mounting.

Figure 10:
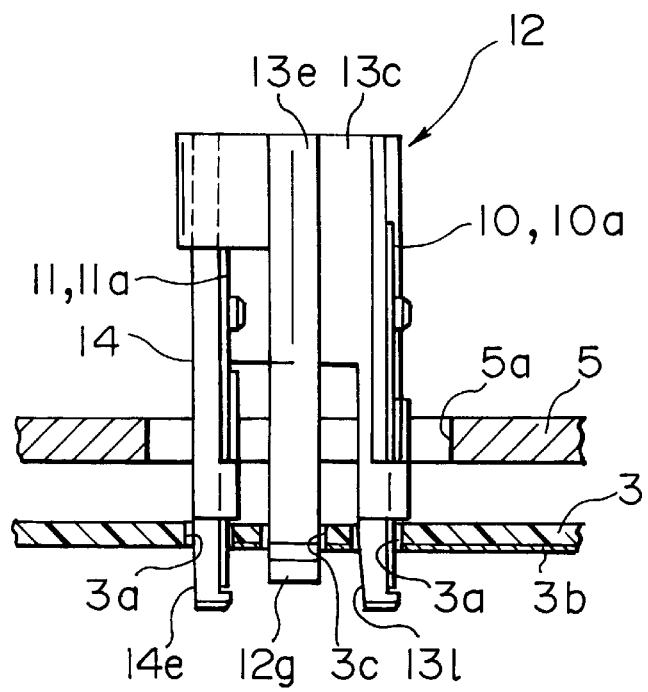
FIG. 10 is a side sectional view of an essential part of a holding member according to a second embodiment of the present invention, showing the holding member as mounted to a hard circuit board.

FIG. 10 shows another embodiment of the holding member 12. As shown in FIG. 10, when there is sufficient room for the wiring space of the board 3, it is also possible to further extend the engagement sections 13f and 13g of the protrusions 13d and 13e of the opposed, first and second flat portions 13a and 13c and directly insert the engagement sections 13f and 13g into a hole 3c newly provided in the board 3 to thereby mount the holding member 12.

While in the above-described holding member 12 two FPCs 10 and 11 are integrally mounted, it is also possible, according to a third embodiment, to use two holding members to each of which one FPC is mounted. This third embodiment will be described with reference to FIGS. 12 through 14.

Figure 12:
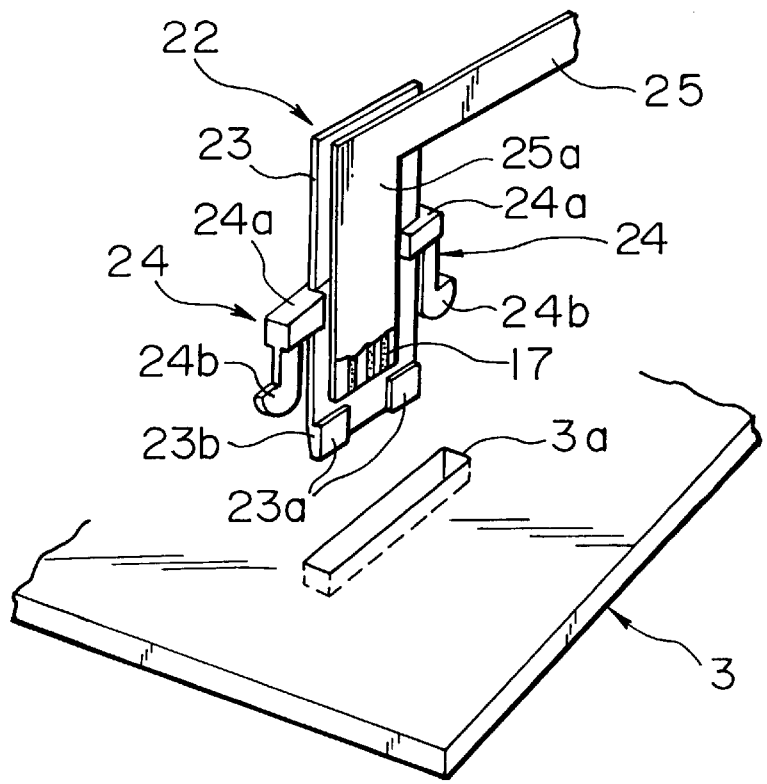
FIG. 12 is a perspective view showing an FPC mounting structure according to a third embodiment of the present invention.
Figure 13:
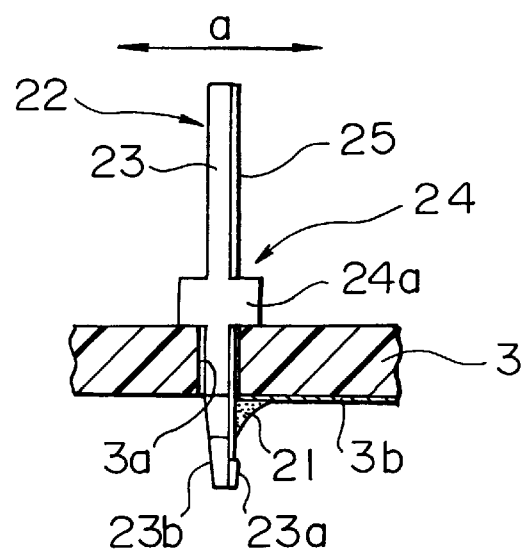
FIG. 13 is a side sectional view showing an essential part of the third embodiment of the present invention.

In FIG. 12, a holding member according to the present invention is composed of a plate-like flat portion 23, engagement sections 24 each of which including a flange section 24a integrally formed substantially at the center of either side of the flat portion 23 so as to protrude outwardly and a hook 24b extending downward from the flange section 24a along the flat portion 23, and a pair of protrusions provided at the lower end of the flat portion 23. Further, a part of the back side of the flat portion 23 corresponding to the protrusions 23 are formed as a tapered section 23b.

A terminal section 25a of an FPC 25 similar to those described above is glued to the surface of the flat portion 23 of the holding member 22 by means of a double-coated adhesive tape (not shown) provided on the back side thereof.

Figure 14:
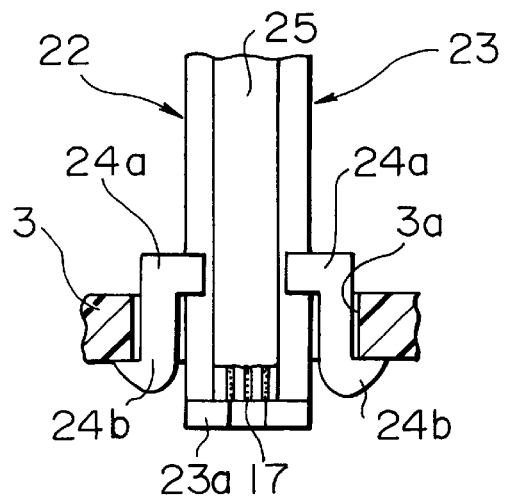
FIG. 14 is a front sectional view showing an essential part of the third embodiment of the present invention.

In this way, when mounting the holding member 22 equipped with one FPC 25 to the board 3, the lower end of the holding member 22 is inserted into the hole 3a of the board 3 while being guided by the tapered section 23b, and further pushed in against the resilient force of the engagement sections 24 to thereby mount the holding member 22 to the board 3 by virtue of the resilient force of the flange sections 24a and the hooks 24b, as shown in FIG. 14. In this process, the flange sections 24a serve as a support to prevent the holding member 22 from tottering with respect to the directions in which the carriage 8 moves. Further, the protrusions 23a help to prevent the FPC 25 from being turned up as a result of the FPC 25 hitting against the edge portion of the hole 3a at the time of mounting. Further, as in the case of the above-described first embodiment, the function of the tapered section 23b is designed so as to facilitate the soldering, etc.

Finally, electrical conduction is established between the wiring pattern 17 of the FPC 25 and the electric circuit 3b provided on the back side of the board 3 by means of solder 21 or the like to thereby complete the mounting. The other FPC is mounted by means of a similar holding member 22.

In this embodiment also, though not shown, as in the above-described first embodiment, the engagement section 24 consisting of the flange sections 24a and the hooks 24b may be inserted into the through-hole 5a of the chassis 5 to thereby fasten the holding member 22 to the chassis 5.

Figure 15:
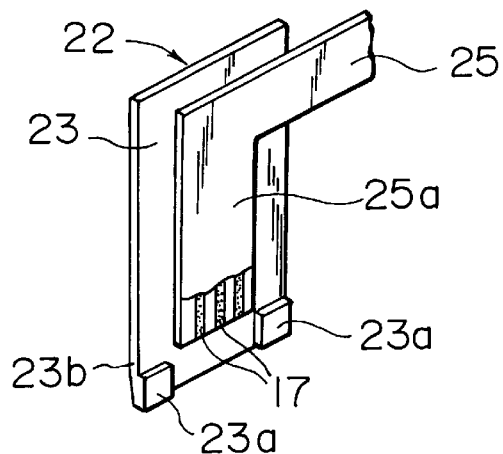
FIG. 15 is a perspective view showing an FPC mounting structure according to a fourth embodiment of the present invention.
Figure 16:
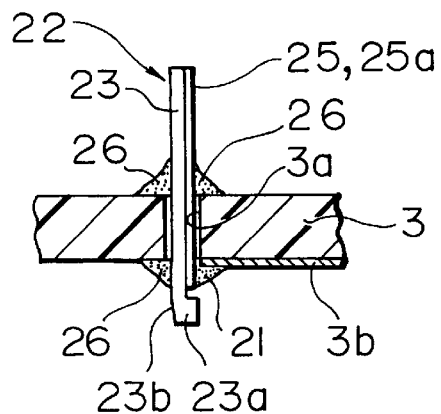
FIG. 16 is a side sectional view showing an essential part of the fourth embodiment of the present invention.
Figure 17:
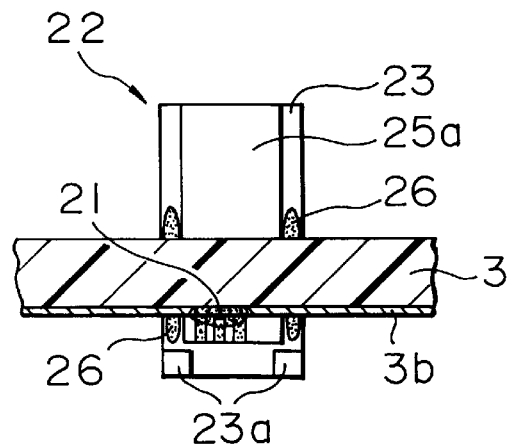
FIG. 17 is a front sectional view showing an essential part of the fourth embodiment of the present invention.

Next, a fourth embodiment of the holding member of the present invention will be described with reference to FIGS. 15 through 17. In the holding member 22 of this embodiment, the engagement section 24 of the holding member 22 described with reference to the third embodiment is omitted. Protrusions 23a are formed at the lower end of the front surface of the flat portion 23, and a tapered section 23b is formed at the lower end of the back side of the flat portion 23. The terminal section 25a of the FPC 25 is attached to substantially the center of the plate surface of the flat portion 23 by means of a double-coated adhesive tape (not shown).

When mounting the holding member 22 to the hard circuit board 3, the lower end of the holding member 22 is inserted into the hole 3a of the board 3, and the electric circuit 3b provided on the back side of the board 3 is connected to the wiring pattern 17 of the FPC 25 by the solder 21, etc. Further, an ordinary adhesive 26, such as epoxy resin adhesive, is applied to the front and back sides of the board 3 and both sides of the flat portion 23, whereby the holding member 22 is secured to the board 3. It is also possible to apply the adhesive to the flat portion beforehand, and then melt it to attach the flat portion 23 and the board 3 to each other.

Figure 18:
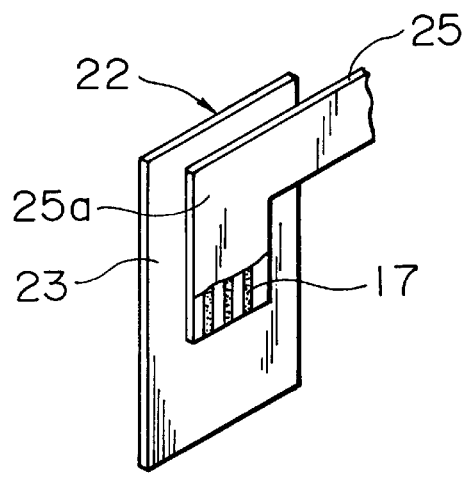
FIG. 18 is a perspective view showing an FPC mounting structure according to a fifth embodiment of the present invention.
Figure 19:
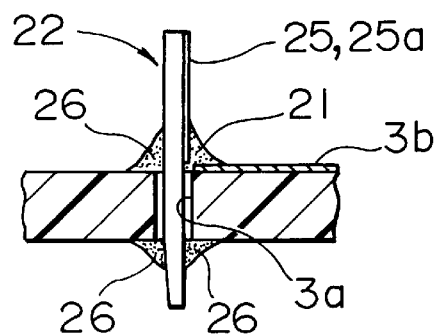
FIG. 19 is a side sectional view showing an essential part of the fifth embodiment of the present invention.
Figure 20:
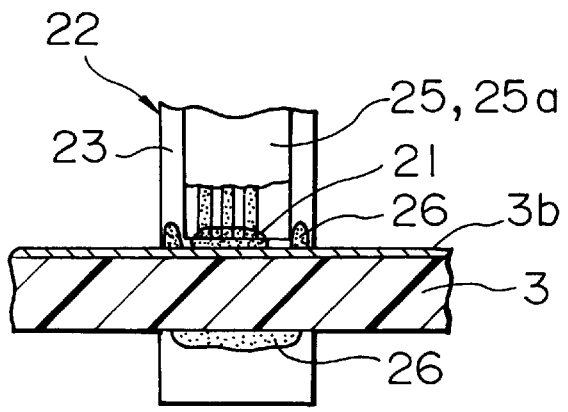
FIG. 20 is a front sectional view showing an essential part of the fifth embodiment of the present invention.
Figure 21:
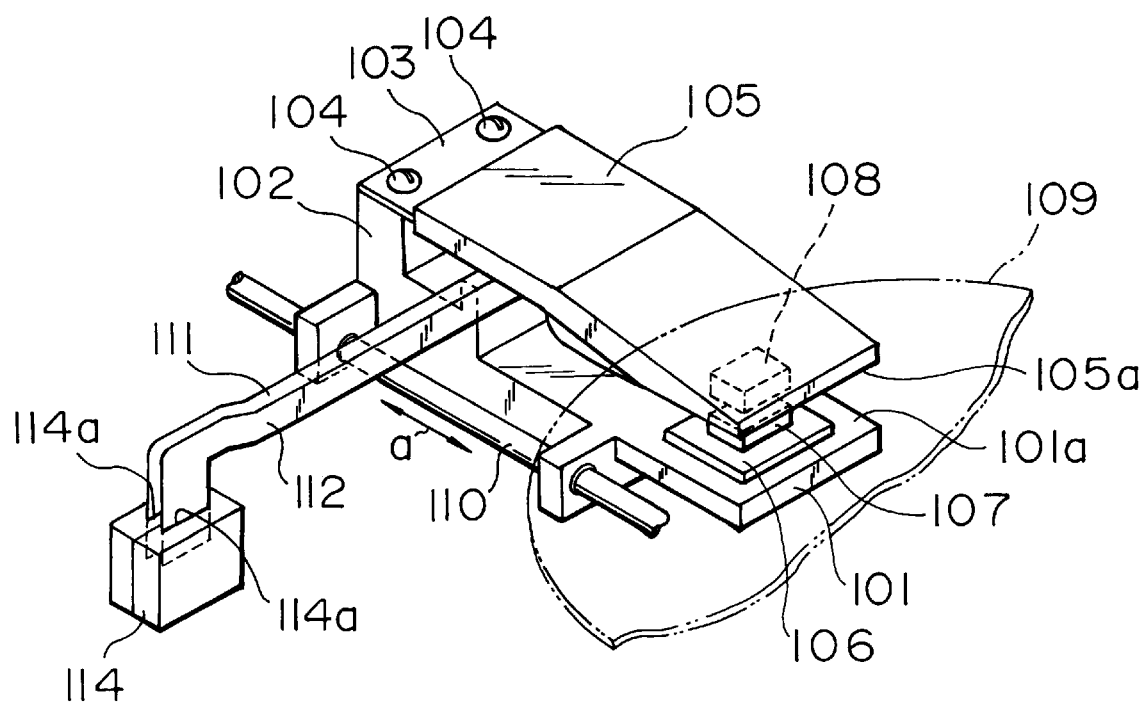
FIG. 21 is a perspective view of a conventional recording/apparatus that is identical as PRIOR ART.
Figure 22:
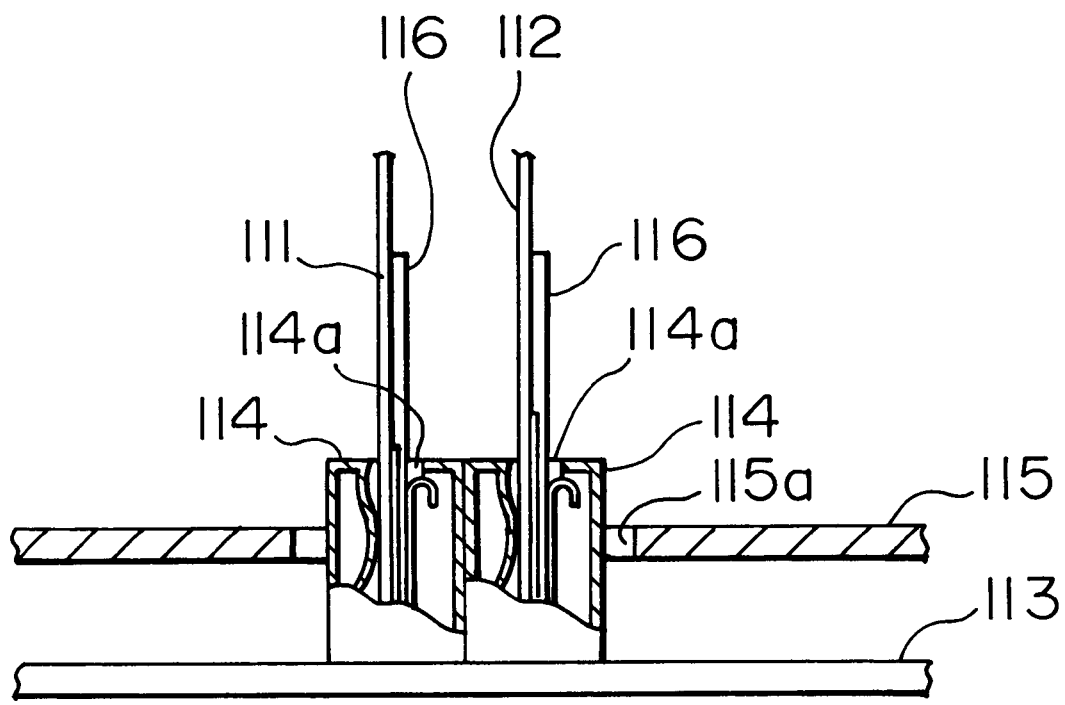
FIG. 22 is a front, partially cross section, view of a prior art connector mounted on a rigid hard circuit base board this is identified as PRIOR ART.

Next, a fifth embodiment of the present invention will be described with reference to FIGS. 18 through 20. The holding member 22 of the present invention consists of a simple plate-like flat portion 23, to the surface of which the terminal section 25a of one FPC 25 is glued by a double-coated adhesive tape (not shown). The lower end of the terminal section 25a is spaced apart from the lower end of the flat portion 23 by a certain distance.

Then, the lower end of the holding member 22 is inserted into the hole 3a of the hard circuit board 3. In this process, the terminal section 25a of the FPC 25 is not inserted into the hole 3a but situated in the vicinity of the surface of the board 3. Thus, in the case of this embodiment, the electric circuit 3b provided on the surface of the board 3 is connected to the wiring pattern 17 of the FPC 22 by the solder 21 or the like. Further, as in the case of the fourth embodiment, the holding member 22 is attached to the board 3 by means of the adhesive 26.

As described above, in accordance with the present invention, the terminal section of an FPC is attached to a holding member, and this holding member is secured to a hard circuit board. That is, since the FPC is mounted to the board through the intermediation of the holding member, there is no need to use an expensive connector, thereby achieving a reduction in cost. Further, since the holding member is reliably secured to the board, there is no concern that disconnection will be generated due to separation of the solder of the FPC and the board even when the FPC is repeatedly moved during operation. Further, due to the use of the holding member, an improvement can be achieved in terms of operability as compared to the case in which the FPC is directly mounted to the board.

Further, due to the protrusion provided in the vicinity of the lower end of the holding member, it is possible to prevent the terminal section from being turned up or separated at the time of mounting to the hard circuit board. Further, due to the tapered section provided at the lower end of the back side of the holding member, it is possible to bring the wiring pattern of the FPC into close contact with the electric circuit of the hard circuit board, thereby facilitating the establishment of electrical conduction between them through solder or the like.

Further, in accordance with the present invention, the holding member is composed of a main body portion and a door portion rotatably provided on the main body portion, and the terminal sections FPCs are attached to the main body portion and the door portion, the holding member being secured to the hard circuit board, so that it is possible to mount a pair of FPCs simultaneously on the board, thereby achieving a further improvement in terms of operability.

Further, in accordance with the present invention, an engagement section is provided on the holding member, and this engagement section is engaged with the chassis, so that there is no need to provide an extra space for mounting the holding member to the hard circuit board, and since it is engaged with the chassis, the mounting strength is enhanced.

Further, in accordance with the present invention, the FPC mounting structure as described above is applied to a recording/reproducing apparatus, which is remarkably advantageous in that it is possible to provide a very inexpensive recording/reproducing apparatus.

What is claimed is:

1. A flexible printed circuit board mounting structure comprising a holding member which comprises a main body portion and a door portion rotatably provided on said main body portion, wherein terminal sections of flexible printed circuit boards are mounted to each of said main body portion and said door portion, said holding member being secured to a hard circuit board to thereby establish an electrical connection between wiring patterns of said terminal sections and an electric circuit of said hard circuit board, wherein said terminal sections of said flexible printed circuit boards are mounted to each of said main body portion and said door portion such that they are parallel and in the same direction with each other; and wherein a portion continuous to the terminal section of said flexible circuit board mounted to said main body portion extends in a direction parallel with a portion continuous to the terminal section of said flexible circuit board mounted to said door body portion.

2. A flexible printed circuit board mounting structure according to claim 1, wherein said main body portion is formed so as to have a substantially U-shaped cross-sectional configuration, wherein the opening section of said main body portion can be closed by said door portion, and wherein said door portion is rotatable about a fulcrum disposed in a thin-walled section formed in said main body portion.

3. A flexible printed circuit-board mounting structure according to claim 1, wherein said holding member includes an engagement section, wherein said holding member is secured to said hard circuit board or to a chassis on which said hard circuit board is arranged by means of said engagement section, said main body portion including a resilient engagement section wherein said holding member is resiliently engaged with either holes formed in said hard circuit board or holes formed in said chassis having the hard circuit board and fixed by said engagement section.

4. A flexible printed circuit board mounting structure according to claim 2, wherein an engagement section is provided on said holding member, said holding member being secured to said hard circuit board or to a chassis on which said hard circuit board is arranged by means of said engagement section, said main body portion including a resilient engagement section wherein said holding member is resiliently engaged with either holes formed in said hard circuit board or holes formed in said chassis having the hard circuit board and fixed by said engagement section.

5. A flexible printed circuit board mounting structure according to claim 1, wherein said holding member includes a protrusion, said protrusion arranged in the vicinity of said lower end of said holding member wherein said terminal part of said flexible printed circuit board is fixed.

6. A flexible printed circuit board mounting structure according to claim 5, wherein a tapered section is formed at the lower end of the back side of said holding member opposite to said protrusion, and wherein said tapered section is inclined toward said terminal section of said flexible printed circuit board.

7. A flexible printed circuit board mounting structure according to claim 2, wherein said holding member includes a protrusion, said protrusion arranged in the vicinity of said lower end of said holding member wherein said terminal part of said flexible printed circuit board is fixed.

8. A flexible printed circuit board mounting structure according to claim 7, wherein a tapered section is formed at the lower end of the back side of said holding member opposite to said protrusion, and wherein said tapered section is inclined toward said terminal section of said flexible printed circuit board.

9. A flexible printed circuit board mounting structure according to claim 3, wherein said holding member includes a protrusion, said protrusion arranged in the vicinity of said lower end of said holding member wherein said terminal part of said flexible printed circuit board is fixed.

10. A flexible printed circuit board mounting structure according to claim 9, wherein a tapered section is formed at the lower end of the back side of said holding member opposite to said protrusion, and wherein said tapered section is inclined toward said terminal section of said flexible printed circuit board.

11. A flexible printed circuit board mounting structure according to claim 4, said holding member includes a protrusion, said protrusion arranged in the vicinity of said lower end of said holding member wherein said terminal part of said flexible printed circuit board is fixed.

12. A flexible printed circuit board mounting structure according to claim 11, wherein a tapered section is formed at the lower end of the back side of said holding member opposite to said protrusion, and wherein said tapered section is inclined toward said terminal section of said flexible printed circuit board.

13. A recording/reproducing apparatus, including a chassis; a hard circuit board including an electric circuit; a holding member; and a flexible printed circuit board including a terminal section having a wiring pattern thereon, and wherein said terminal section of the flexible printed circuit board, for transmitting recording/reproducing, is mounted to said holding member, wherein said hard circuit board is arranged on the chassis, and wherein said holding member is plugged into said hard circuit board, whereby the wiring pattern of said terminal section is brought into close contact with the electric circuit of said hard circuit board to thereby facilitate soldering the wiring pattern to the electric circuit.

14. A recording/reproducing apparatus according to claim 13, wherein there is provided a carriage on which a recording/reproducing head is mounted which is capable of moving along a radial dimension of a disk, said flexible printed circuit board being led out so as to be connected to said recording/reproducing head.

15. A recording/reproducing apparatus according to claim 13, wherein an engagement section is provided on said holding member, said engagement section being engaged with said chassis.

16. A recording/reproducing apparatus according to claim 15, wherein there is provided a carriage on which a recording/reproducing head is mounted which is capable of moving along a radial dimension of a disk, said flexible printed circuit board being led out so as to be connected to said recording/reproducing head.

\* \* \* \* \*